(12) United States Patent
Miyagawa et al.

(10) Patent No.: US 12,136,764 B2
(45) Date of Patent: Nov. 5, 2024

(54) HIGH-FREQUENCY CIRCUIT AND RADIO DEVICE

(71) Applicants: Sumitomo Electric Industries, Ltd., Osaka (JP); AutoNetworks Technologies, Ltd., Yokkaichi (JP); Sumitomo Wiring Systems, Ltd., Yokkaichi (JP)

(72) Inventors: Yuta Miyagawa, Osaka (JP); Chaoran Li, Yokkaichi (JP)

(73) Assignees: SUMITOMO ELECTRIC INDUSTRIES, LTD., Osaka (JP); AUTONETWORKS TECHNOLOGIES, LTD., Yokkaichi (JP); SUMITOMO WIRING SYSTEMS, LTD., Yokkaichi (JP)

( * ) Notice: Subject to any disclaimer, the term of this patent is extended or adjusted under 35 U.S.C. 154(b) by 142 days.

(21) Appl. No.: 18/105,893

(22) Filed: Feb. 6, 2023

(65) Prior Publication Data

US 2023/0187840 A1   Jun. 15, 2023

Related U.S. Application Data

(63) Continuation of application No. PCT/JP2021/026966, filed on Jul. 19, 2021.

(30) Foreign Application Priority Data

Aug. 7, 2020   (JP) .................................. 2020-134329

(51) Int. Cl.
*H01Q 15/00* (2006.01)
*H01Q 1/22* (2006.01)
*H04B 1/18* (2006.01)

(52) U.S. Cl.
CPC ....... *H01Q 15/0006* (2013.01); *H01Q 1/2283* (2013.01); *H04B 1/18* (2013.01)

(58) Field of Classification Search
CPC .... H01Q 15/0006; H01Q 1/2283; H04B 1/18; H01P 1/20327; H05K 3/46
See application file for complete search history.

(56) References Cited

U.S. PATENT DOCUMENTS 9,577,310 B2 *   2/2017   Kuwabara ............... H01L 23/12
11,489,247 B2 *   11/2022   Zhou .................... H01Q 9/0442

FOREIGN PATENT DOCUMENTS

JP   4-288702 A   10/1992
JP   2001-44712 A   2/2001

(Continued)

*Primary Examiner* — Seung H Lee
(74) *Attorney, Agent, or Firm* — XSENSUS LLP (57) ABSTRACT

A high-frequency circuit includes: a first ground layer having an electric conductor formed therein; a second ground layer having an electric conductor formed therein; and a conductive pattern layer having a first conductive pattern formed thereon. The first ground layer, the second ground layer, and the conductive pattern layer are laminated one on another. The conductive pattern layer includes a first area in which a distance to the electric conductor formed in the second ground layer is longer than a distance to the electric conductor formed in the first ground layer, in a lamination direction in which the first ground layer, the second ground layer, and the conductive pattern layer are laminated. At least a part of the first conductive pattern is disposed in the first area.

10 Claims, 6 Drawing Sheets

(56) References Cited

FOREIGN PATENT DOCUMENTS

| | | | |
|---|---|---|---|
| JP | 2002-271109 | A | 9/2002 |
| JP | 2002-368502 | A | 12/2002 |
| JP | 2003-110311 | A | 4/2003 |
| JP | 2006-262396 | A | 9/2006 |
| JP | 2010-87830 | A | 4/2010 |
| JP | 2013-251863 | A | 12/2013 |

* cited by examiner

HIGH-FREQUENCY CIRCUIT AND RADIO DEVICE

CROSS-REFERENCE TO RELATED APPLICATIONS

The present application is a bypass continuation of PCT Application No. PCT/JP2021/026966, filed Jul. 19, 2021, which claims priority to Japanese Patent Application No. 2020-134329, filed Aug. 7, 2020, the entire contents of each are incorporated herein by its reference.

TECHNICAL FIELD

The present disclosure relates to a high-frequency circuit and a radio device. This application claims priority on Japanese Patent Application No. 2020-134329 filed on Aug. 7, 2020, the entire content of which is incorporated herein by reference.

BACKGROUND ART

Japanese Laid-Open Patent Publication No. 2010-87830 (PATENT LITERATURE 1) discloses a radio device in which SIRs are mounted on a multilayer board. In this radio device, two SIRs are formed in different layers of the multilayer board, respectively. The two SIRs are formed so as to overlap each other as viewed in a lamination direction of the multilayer board.

CITATION LIST

Patent Literature

PATENT LITERATURE 1: Japanese Laid-Open Patent Publication No. 2010-87830

SUMMARY OF THE INVENTION

A high-frequency circuit according to the present disclosure includes: a first ground layer having an electric conductor formed therein; a second ground layer having an electric conductor formed therein; and a conductive pattern layer having a first conductive pattern and a second conductive pattern formed thereon. The first ground layer, the second ground layer, and the conductive pattern layer are laminated on one another. An electrical distance from the conductive pattern layer to the second ground layer is longer than an electrical distance from the conductive pattern layer to the first ground layer. The conductive pattern layer includes a first area in which at least a part of the first conductive pattern is disposed and a second area in which at least a part of the first conductive pattern is disposed. A cavity is formed in a portion of the first ground layer opposing the first area in a lamination direction in which the first ground layer, the second ground layer and the conductive pattern layer are laminated, and the electric conductor is formed in a portion of the second ground layer opposing the second area in the lamination direction. Among an electrical distance from the first area to the electric conductor formed in the second ground layer and an electrical distance from the first area to the electric conductor formed in the first ground layer, the electrical distance from the first area to the electric conductor formed in the second ground layer is longer, in the lamination direction.

One aspect of the present disclosure can be realized as a semiconductor integrated circuit that realizes a part or the entirety of the high-frequency circuit, or can be realized as a communication system that includes the high-frequency circuit.

DETAILED DESCRIPTION

A radio device extracts a component in a specific frequency band from a received radio wave, for example, and performs various types of signal processing. As means for extracting a signal wave in a specific frequency band, filters have been known.

While there are various types of filters, a stepped impedance resonator (SIR) is sometimes used as a filter in terms of miniaturization of the radio device. The SIR is a type of pattern filter that is composed of a conductive pattern formed on a board. The SIR has a structure obtained by combining a low impedance part having a wide pattern width and a high impedance part having a narrow pattern width.

Problems to be Solved by the Present Disclosure

In a case where two SIRs are formed in the same layer of a multilayer board, the size of the multilayer board needs to be increased in order to secure a placement space for these SIRs. Meanwhile, in the radio device disclosed in PATENT LITERATURE 1, the two SIRs are formed in different layers. Therefore, the size of the multilayer board need not be increased, thereby miniaturizing the radio device.

However, the width of a conductive pattern that forms an SIR is deeply related to the frequency characteristics of the SIR. Therefore, even in the radio device described in PATENT LITERATURE 1, the width of the conductive pattern may become too wide depending on a cutoff frequency to be set, which may result in difficulty in placing the conductive pattern, or an increase in the size of the radio device.

In order to resolve the above problems, it is conceivable to narrow the width of the conductive pattern. In this case, however, it may become difficult to set a desired characteristic impedance in the SIR, or difficult to form the conductive pattern. Therefore, in the pattern filter, it is difficult to freely design a cutoff frequency, a passband width, etc., while maintaining a desired characteristic impedance.

The present disclosure has been made to solve the above problems, and an object of the present disclosure is to provide a high-frequency circuit and a radio device capable of increasing the degree of freedom in device design while realizing a desired characteristic impedance in a pattern filter.

Effects of the Present Disclosure

According to the present disclosure, it is possible to increase the degree of freedom in device design, while realizing a desired characteristic impedance in a pattern filter.

Description of Embodiment of the Present Disclosure

First, the contents of embodiments of the present disclosure are listed and described.

(1) A high-frequency circuit according to an embodiment of the present disclosure includes: a first ground layer having an electric conductor formed therein; a second ground layer having an electric conductor formed therein; and a conductive pattern layer having a first conductive pattern and a second conductive pattern formed thereon. The first ground layer, the second ground layer, and the conductive pattern layer are laminated one on another. An electrical distance from the conductive pattern layer to the second ground layer is longer than an electrical distance from the conductive pattern layer to the first ground layer. The conductive pattern layer includes a first area in which at least a part of the first conductive pattern is disposed and a second area in which at least a part of the first conductive pattern is disposed. A cavity is formed in a portion of the first ground layer opposing the first area in a lamination direction in which the first ground layer, the second ground layer and the conductive pattern layer are laminated, and the electric conductor is formed in a portion of the second ground layer opposing the second area in the lamination direction. Among an electrical distance from the first area to the electric conductor formed in the second ground layer and an electrical distance from the first area to the electric conductor formed in the first ground layer, the electrical distance from the first area to the electric conductor formed in the second ground layer is longer, in the lamination direction.

In the case where a filter is formed of a conductive pattern, the characteristic impedance and the frequency characteristics of the filter are varied depending on the width of the conductive pattern, which may hinder desired characteristics from being achieved.

Meanwhile, in the above configuration, since at least a part of the first conductive pattern is disposed in the first area, the electrical distance from the first conductive pattern to the ground layer can be increased. When the electrical distance from the first conductive pattern to the ground layer is increased, the characteristic impedance of the first conductive pattern rises. Therefore, a reduction in the characteristic impedance of the first conductive pattern due to an increase in the width of the first conductive pattern can be offset by the increase in the electrical distance from the first conductive pattern to the ground layer. Thus, the width of the first conductive pattern can be increased while maintaining a desired characteristic impedance. Therefore, the degree of freedom in device design can be increased while realizing the desired impedance in the pattern filter.

In the case where an SIR having a coupled line is formed of a conductive pattern, a long coupled line is required in order to realize a large passband width, which may increase the size of the board. In order to reduce the length of the coupled line while maintaining the passband width, the degree of coupling of the coupled line needs to be increased. The degree of coupling can be increased by increasing the width of the conductive pattern. Thus, a desired passband width can be set while reducing the length of the coupled line. On the other hand, the increase in the width of the conductive pattern causes a reduction in the characteristic impedance of the SIR.

Meanwhile, in the above configuration, since at least a part of the first conductive pattern is disposed in the first area, a reduction in the characteristic impedance of the first conductive pattern due to an increase in the width of the first conductive pattern can be offset by an increase in the electrical distance from the first conductive pattern to the ground layer. Thus, the length of the coupled line can be reduced while maintaining a desired characteristic impedance. Therefore, the degree of freedom in device design can be increased while realizing the desired impedance in the pattern filter.

(2) The electrical distance from the second area to the electric conductor formed in the second ground layer and an electrical distance from the second area to the electric conductor formed in the first ground layer may be equal.

In this configuration, by forming a conductor in the first ground layer, the electrical distance from the second area to the second ground layer is equal to the electrical distance from the second area to the first ground layer. Therefore, the characteristic impedance of the conductive pattern can be adjusted by forming a conductor or a cavity in the first ground layer, the degree of freedom in device design can be further increased.

(3) The first conductive pattern may be disposed over the first area and the second area.

In this configuration, a filter with a high degree of freedom in which the first conductive pattern is disposed over the first area and the second area can be formed in the conductive pattern layer.

(4) The first conductive pattern may form a part of a first filter, the second conductive pattern may form a part of a second filter, and the second filter may have a fractional bandwidth that is narrower than a fractional bandwidth of the first filter.

In a band-pass filter, a fractional bandwidth is represented by a value obtained by dividing a passband width with a center frequency. A band-pass filter having a wide fractional bandwidth requires a long coupled line, and a band-pass filter having a narrow fractional bandwidth requires a short coupled line. In the above configuration, since the fractional bandwidth of the second filter is narrower than the fractional bandwidth of the first filter, the first conductive pattern constituting the first filter having a wide fractional bandwidth is disposed in the first area in which the length of the coupled line can be increased, while the second conductive pattern constituting the second filter having a narrow fractional bandwidth is disposed in the second area in which the length of the coupled line can be reduced. Therefore, the degree of freedom in device design can be increased while realizing a desired fractional bandwidth in each filter.

(5) The first area may be provided such that a characteristic impedance of the first conductive pattern becomes a constant value with respect to a frequency of a target signal.

In this configuration, in a transmission path, for a target signal, including a filter, the degree of freedom in device design can be increased while realizing a desired impedance.

A radio device according to the embodiment of the present disclosure includes the high-frequency circuit described above.

In this configuration, in the radio device, the degree of freedom in device design can be increased while realizing a desired characteristic impedance in the pattern filter.

Hereinafter, embodiments of the present disclosure will be described with reference to the drawings. In the drawings, the same or corresponding parts are denoted by the same reference signs, and descriptions thereof are not repeated. At least some parts of the embodiments described below can be combined together as desired.

First, how the ideas for the high-frequency circuit and the radio device of the present disclosure have been conceived, will be described.

Figure 1:
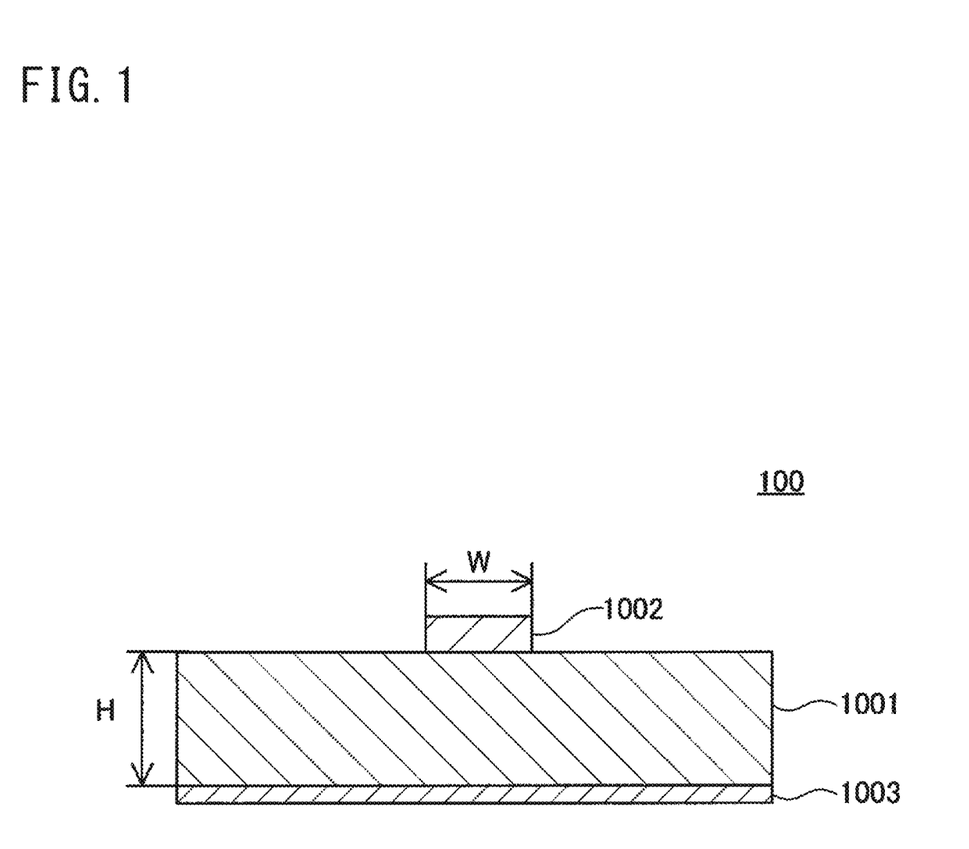
FIG. 1 is a cross-sectional view schematically showing a filter formed of a conductive pattern.

FIG. 1 is a cross-sectional view schematically showing a filter formed of a conductive pattern. With reference to FIG. 1, a filter 100 includes a linear conductive pattern 1002 formed at a front surface of a plate-shaped dielectric layer 1001, and a ground layer 1003 formed at a rear surface of the dielectric layer 1001. The filter 100 is a pattern filter having a microstrip line structure. In the filter 100, a constant of an LC circuit constituting a filter is replaced with a conductive pattern. Specifically, L (coil) is replaced with a high-impedance conductive pattern, and C (capacitor) is replaced with a low-impedance conductive pattern.

Here, the characteristic impedance of the conductive pattern 1002 is mainly affected by a width W of the conductive pattern 1002, and a distance (a spatial distance) H from the conductive pattern 1002 to the ground layer 1003. Assuming that the distance H is constant, the wider the width W is, the lower the characteristic impedance is, and the narrower the width W is, the higher the characteristic impedance is.

Meanwhile, assuming that the width W is constant, the longer the distance H is, the higher the characteristic impedance is, and the shorter the distance H is, the lower the characteristic impedance is. Therefore, in designing the filter 100, the width W and the distance H of the conductive pattern 1002 are adjusted to set a desired characteristic impedance.

However, if the width W of the conductive pattern 1002 is too wide, it is difficult, in terms of space, to dispose the conductive pattern 1002 on the board, and the size of the filter 100 is increased. On the other hand, if the width W of the conductive pattern 1002 is too narrow, it is difficult to manufacture the conductive pattern 1002. Therefore, depending on the characteristic impedance, of the conductive pattern 1002, to be set in the filter 100, it is sometimes difficult to realize a desired width W of the conductive pattern 1002.

Figure 2:
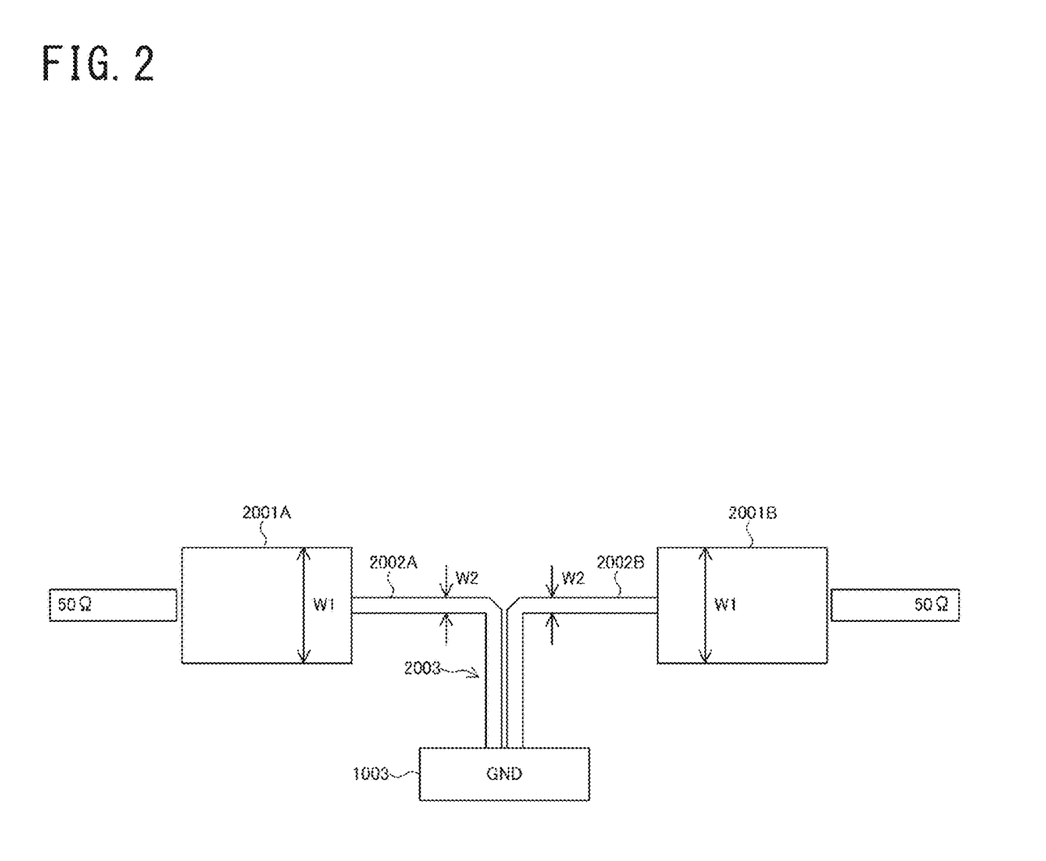
FIG. 2 is a plan view schematically showing an example of a band-pass filter formed of a conductive pattern.

FIG. 2 is a plan view schematically showing an example of a band-pass filter formed of a conductive pattern. With reference to FIG. 2, a band-pass filter 200 is, for example, a stepped impedance resonator (SIR) that is formed by combining: low impedance parts 2001A, 2001B each being formed of a conductive pattern having a width W1; and high impedance parts 2002A, 2002B each being formed of a conductive pattern having a width W2 narrower than the width W1. The high impedance part 2002A and the high impedance part 2002B form a coupled line 2003 by being disposed with a slight gap between them. Each of the low impedance parts 2001A, 2001B and the high impedance parts 2002A, 2002B is formed of the conductive pattern 1002 as shown in FIG. 1.

The low impedance parts 2001A, 2001B are different in characteristic impedance from the high impedance parts 2002A, 2002B. In the SIR, a resonance condition, i.e., a cutoff frequency, is set by adjusting the width and the length of the low impedance parts 2001A, 2001B and the width and the length of the high impedance parts 2002A, 2002B.

Generally, coupling of a coupled line of a band-pass filter is performed through an electromagnetic field. In the band-pass filter 200 shown in FIG. 2, the coupled line 2003 is connected to the ground layer 1003 shown in FIG. 1 such that the coupling through a magnetic field is strengthened by causing a current to flow.

The length of the coupled line 2003 affects the passband width in the band-pass filter. The shorter the coupled line 2003 is, the narrower the passband width is. The longer the coupled line 2003 is, the wider the passband width is. Therefore, in designing the band-pass filter 200 using the SIR having the coupled line 2003, the length of the coupled line 2003 is adjusted to set a desired passband width.

Meanwhile, when the coupled line 2003 is too short, it is difficult, in terms of manufacture, to form the coupled line 2003 on the board. In this case, it is conceivable to reduce the degree of coupling of the coupled line 2003 by increasing the length of the coupled line 2003. In order to reduce the degree of coupling of the coupled line 2003, the width of the conductive pattern needs to be narrowed. However, if the width of the conductive pattern is narrowed, the characteristic impedance changes, and the cutoff frequency of the band-pass filter deviates from a set value.

If the coupled line 2003 is too long, the size of the board is increased to secure a space for placing the coupled line 2003. In this case, it is conceivable to increase the degree of coupling of the coupled line 2003 by reducing the length of the coupled line 2003. In order to increase the degree of coupling of the coupled line 2003, the width of the conductive pattern needs to be increased. However, if the width of the conductive pattern is increased, the characteristic impedance changes, and the cutoff frequency of the band-pass filter deviates from the set value.

Therefore, depending on the passband width to be set, it is sometimes difficult to ensure a desired length of the coupled line 2003.

As described above, in the conventional art, when the filter is formed of the conductive pattern, a restriction imposed on the width of the conductive pattern or the length of the coupled line makes it difficult to realize a desired cutoff frequency or passband width. Because of the background as described above, the radio device of the present disclosure has been conceived.

Hereinafter, the high-frequency circuit and the radio device according to the embodiment of the present disclosure will be described.

Figure 3:
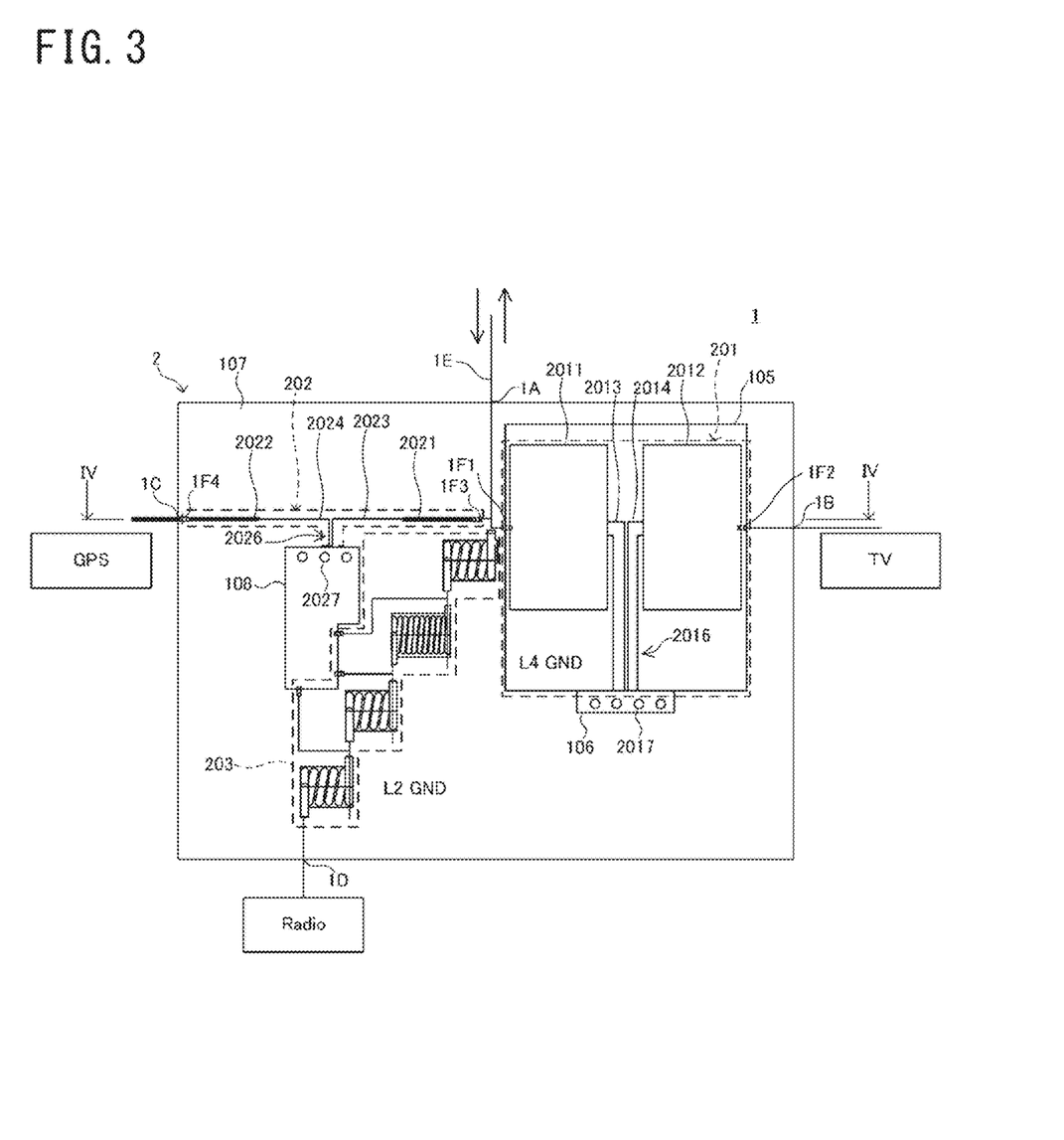
FIG. 3 is a plan view showing a configuration of a radio device according to an embodiment of the present disclosure.

FIG. 3 is a plan view showing a configuration of a radio device according to the embodiment of the present disclosure. FIG. 3 shows a radio device 1 mounted on a vehicle, for example.

With reference to FIG. 3, the radio device 1 includes a high-frequency circuit 2, an input/output terminal 1A, a television input/output terminal 1B, a GPS (Global Positioning System) input/output terminal 1C, and a radio input/output terminal 1D.

The input/output terminal 1A is connected to an antenna (not shown) through a high-frequency cable 1E. For example, the antenna is mounted on a front windshield, a rear windshield, a roof panel, or the like of a vehicle, and receives an RF signal (Radio Frequency Signal).

Each of the television input/output terminal 1B, the GPS input/output terminal 1C, and the radio input/output terminal 1D is connected to an in-vehicle apparatus (not shown) capable of providing a service using a radio signal in a corresponding frequency band. For example, the television input/output terminal 1B is connected to an in-vehicle apparatus corresponding to a television, such as a television tuner. The GPS input/output terminal 1C is connected to an in-vehicle apparatus corresponding to a GPS, such as a car navigation system. The radio input/output terminal 1D is connected to an in-vehicle apparatus corresponding to an AM/FM radio, such as a radio tuner.

The high-frequency circuit 2 separates a radio wave received at the input/output terminal 1A into a radio wave for the in-vehicle apparatus corresponding to the television, a radio wave for the in-vehicle apparatus corresponding to the GPS, and a radio wave for the in-vehicle apparatus corresponding to the radio. The high-frequency circuit 2 may be configured to combine RF signals transmitted from the in-vehicle apparatus corresponding to the television and the in-vehicle apparatus corresponding to the GPS, and output the combined signal from the input/output terminal 1A.

Figure 4:
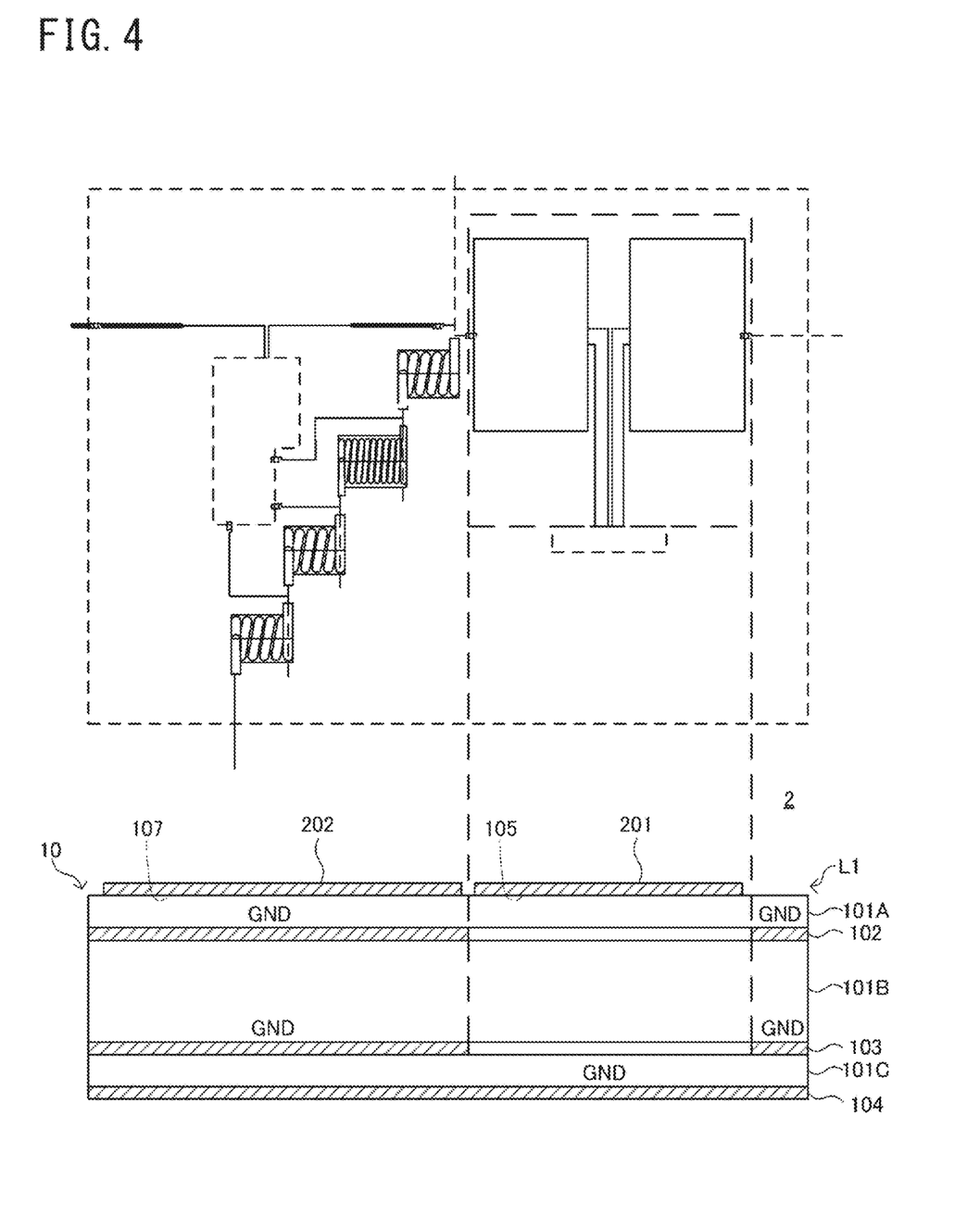
FIG. 4 is a cross-sectional view taken along a line IV-IV in FIG. 3.

FIG. 4 is a cross-sectional view taken along a line IV-IV in FIG. 3. For facilitating the understanding, in FIG. 4, the plan view shown in FIG. 3 is represented by broken lines except for the filters.

With reference to FIG. 4, the high-frequency circuit 2 is composed of a multilayer board 10.

Multilayer Board

The multilayer board 10 is a printed circuit board, for example. The multilayer board 10, from a main surface side in a lamination direction, includes a layer L1 having a conductive pattern 201 formed thereon, a dielectric layer 101A, a first ground layer 102, a dielectric layer 101B, an intermediate ground layer 103, a dielectric layer 101C, and a second ground layer 104 in this order.

The layer L1 having the conductive pattern 201 formed thereon forms a main surface of the multilayer board 10, and includes the conductive pattern and the like. Hereinafter, a layer having the conductive pattern 201 formed thereon is referred to as a conductive pattern layer. The conductive pattern 201 is an example of a first conductive pattern.

The dielectric layer 101A is disposed between the conductive pattern layer L1 and the first ground layer 102, and insulates the conductive pattern layer L1 and the first ground layer 102 from each other. The material of the dielectric layer 101A is glass epoxy resin, for example. The same applies to the dielectric layers 101B, 101C described later.

The first ground layer 102 is a layer different from the conductive pattern layer L1, and is located at a position lower than the conductive pattern layer L1. In the multilayer board 10, the first ground layer 102 is disposed between the dielectric layer 101A and the dielectric layer 101B. The first ground layer 102 is a layer having a thin electric conductor, such as a copper foil, formed therein. The same applies to the intermediate ground layer 103 and the second ground layer 104 described later. The first ground layer 102 has a shape in which the electric conductor is partially removed. A portion where the electric conductor is removed becomes a cavity.

The dielectric layer 101B is disposed between the first ground layer 102 and the intermediate ground layer 103, and insulates the first ground layer 102 and the intermediate ground layer 103 from each other.

The intermediate ground layer 103 is disposed between the dielectric layer 101B and the dielectric layer 101C. The intermediate ground layer 103 has a shape in which the electric conductor is partially removed. A portion where the electric conductor is removed becomes a cavity.

The dielectric layer 101C is disposed between the intermediate ground layer 103 and the second ground layer 104, and insulates the intermediate ground layer 103 and the second ground layer 104 from each other.

The second ground layer 104 is a layer different from the conductive pattern layer L1 and the first ground layer 102, and is located at a position lower than the first ground layer 102. In the multilayer board 10, the second ground layer 104 is disposed below the dielectric layer 101C, and forms a rear surface of the multilayer board 10. Therefore, in the lamination direction, the spatial distance from the conductive pattern layer L1 to the second ground layer 104 is longer than the spatial distance from the conductive pattern layer L1 to the first ground layer 102. "Spatial distance" means a distance in a metric space (three-dimensional space), and a specific example is an Euclidean distance. The second ground layer 104 is disposed substantially over the entire area of the multilayer board 10 in a plan view. The second ground layer 104 is electrically connected to the first ground layer 102 and the intermediate ground layer 103 through vias.

With reference to FIG. 3 and FIG. 4, the conductive pattern layer L1 includes a first area 105 in which an electrical distance to the electric conductor formed in the second ground layer 104 is longer than an electrical distance to the electric conductor formed in the first ground layer 102, in the lamination direction of the first ground layer 102, the second ground layer 104, and the conductive pattern layer L1. That is, among the electrical distance from the first area 105 to the electric conductor formed in the second ground layer 104 and the electrical distance from the first area 105 to the electric conductor formed in the first ground layer 102, the electrical distance from the first area 105 to the electric conductor formed in the second ground layer 104 is longer, in a lamination direction in which the first ground layer 102, the second ground layer 104, and the conductive pattern layer L1 are laminated. "Electrical distance" is an index indicating a positional relationship between two conductors, and is one of factors that determine characteristic impedances of the conductors. The longer the electrical distance is, the higher the characteristic impedances of the conductors are, and the smaller the electrical distance is, the lower the characteristic impedances of the conductors are. When a uniform dielectric exists between two conductors, the larger the spatial distance between the two conductors is, the higher the characteristic impedances are, and the smaller the spatial distance between the two conductors is, the lower the characteristic impedances are. That is, in this case, the electrical distance between the two conductors corresponds to the spatial distance between the two conductors. Such an "electrical distance" is different from an "electrical length" that defines a propagation speed of an electromagnetic wave. For example, the first area 105 is an area that opposes the second ground layer 104 in the lamination direction of the respective layers in the multilayer board 10. Specifically, the first area 105 has a rectangular shape in a plan view, is provided at the conductive pattern layer L1, and has an arbitrary size. As shown in FIG. 4, no electric conductor is disposed in areas, opposing the first area 105, of the first ground layer 102 and the intermediate ground layer 103, and cavities are formed in these areas. Below the first area 105 in the lamination direction, the dielectric layers 101A, 101B, 101C, and the second ground layer 104 are disposed.

The conductive pattern layer L1 includes a second area 107 in which a spatial distance to the electric conductor formed in the first ground layer 102 is longer than a spatial distance to the electric conductor formed in the second ground layer 104, in the lamination direction of the first ground layer 102, the second ground layer 104, and the conductive pattern layer L1. The electrical distance from the second area 107 to the electric conductor formed in the first ground layer 102 and the electrical distance from the second area 107 to the electric conductor formed in the second ground layer 104 are equal, in a lamination direction in which the first ground layer 102, the second ground layer 104, and the conductive pattern layer L1 are laminated. For example, the second area 107 is an area that opposes the first ground layer 102 in the lamination direction of the respective layers in the multilayer board 10. Specifically, the second area 107 is an area other than the first area 105 in the conductive pattern layer L1. The second area 107 does not overlap the first area 105 in the conductive pattern layer L1, and is separated from the first area 105. As shown in FIG. 4, the electric conductor is disposed in an area, opposing the second area 107, of the first ground layer 102. Below the second area 107 in the lamination direction, the dielectric layer 101A and the first ground layer 102 are disposed.

Filter

Referring back to FIG. 3, a conductive pattern formed on the conductive pattern layer L1 of the multilayer board 10 forms a part of a filter. In the multilayer board 10, the conductive pattern 201 forms a part of a television filter. Specifically, the television filter is composed of the conductive pattern 201 and the second ground layer 104. The television filter is an example of a first filter. The television filter is set to have a passband of 470 MHz to 710 MHz, for example. In this case, the television filter has a passband width of 240 MHz, a center frequency of 590 MHz, and a fractional bandwidth of 0.41.

The conductive pattern 201 includes low impedance parts 2011, 2012 and high impedance parts 2013, 2014.

The low impedance parts 2011, 2012 each have a substantially rectangular shape in a plan view, and are disposed side by side at an interval.

The radio device 1 further includes capacitors 1F1, 1F2. The low impedance part 2011 is connected to the input/output terminal 1A via the capacitor 1F1. The low impedance part 2012 is connected to the television input/output terminal 1B via the capacitor 1F2.

The width of the conductive pattern in the high impedance parts 2013, 2014 is narrower than that in the low impedance parts 2011, 2012. The width and the length of the conductive pattern in the high impedance parts 2013, 2014 and the width and the length of the conductive pattern in the low impedance parts 2011, 2012 are appropriately set in accordance with a desired cutoff frequency.

The high impedance parts 2013, 2014 each have a substantially L shape in a plan view, and are disposed side by side between the low impedance parts 2011, 2012. Portions of the high impedance parts 2013, 2014 are disposed in parallel with a slight gap between them, thereby forming a coupled line 2016. In the coupled line 2016, the high impedance parts 2013, 2014 are electromagnetically coupled to each other.

The length of a resonator composed of the low impedance parts 2011, 2012 and the high impedance parts 2013, 2014 is set to be ¼ of the wavelength at the center frequency of the passband. However, the length of the resonator may be ½ of the wavelength at the center frequency of the passband.

At least a part of the conductive pattern 201 is disposed in the first area 105, and is electrically connected to the second ground layer 104. For example, the conductive pattern 201 is disposed within the first area 105, and is not disposed outside the first area 105. The coupled line 2016 in the conductive pattern 201 is connected to a ground pattern 106 formed on the conductive pattern layer L1. The ground pattern 106 has one or a plurality of vias 2017 formed therein. The vias 2017 electrically connect the ground pattern 106 to the second ground layer 104. In FIG. 3, "L4 GND" means that the conductive pattern 201 uses, as a reference ground, the second ground layer 104 corresponding to the fourth layer as a wiring layer.

As shown in FIG. 3 and FIG. 4, on the conductive pattern layer L1, a conductive pattern 202 different from the conductive pattern 201 is further formed. The conductive pattern 202 is an example of a second conductive pattern. In the multilayer board 10, the conductive pattern 202 forms a part of a GPS filter. Specifically, the GPS filter is composed of the conductive pattern 202 and the first ground layer 102. The GPS filter is an example of a second filter.

The conductive pattern 202 is disposed in the second area 107, and is electrically connected to the first ground layer 102. For example, the conductive pattern 202 is disposed within the second area 107, and is not disposed outside the second area 107. The GPS filter is set to have a passband of 1525 MHz to 1625 MHz, for example. In this case, the GPS filter has a passband width of 100 MHz, a center frequency of 1575 MHz, and a fractional bandwidth of 0.06. That is, the fractional bandwidth of the GPS filter is narrower than the fractional bandwidth of the television filter.

Specifically, the conductive pattern 202 includes low impedance parts 2021, 2022 and high impedance parts 2023, 2024.

The low impedance parts 2021, 2022 each have a substantially rectangular shape in a plan view, and are disposed in a straight line at an interval.

The radio device 1 further includes capacitors 1F3, 1F4. The low impedance part 2021 is connected to the input/output terminal 1A via the capacitor 1F3. The low impedance part 2022 is connected to the GPS input/output terminal 1C via the capacitor 1F4.

The width of the conductive pattern in the high impedance parts 2023, 2024 is narrower than that in the low impedance parts 2021, 2022. The width and the length of the conductive pattern in the high impedance parts 2023, 2024 and the width and the length of the conductive pattern in the low impedance parts 2021, 2022 are appropriately set in accordance with a desired cutoff frequency.

The high impedance parts 2023, 2024 each have a substantially L shape in a plan view, and are disposed side by side between the low impedance parts 2021, 2022. Portions of the high impedance parts 2023, 2024 are disposed in parallel with a slight gap between them, thereby forming a coupled line 2026. In the coupled line 2026, the high impedance parts 2023, 2024 are electromagnetically connected to each other.

The length of a resonator composed of the low impedance parts 2021, 2022 and the high impedance parts 2023, 2024 is set to be ¼ of the wavelength at the center frequency of the passband. However, the length of the resonator may be ½ of the wavelength at the center frequency of the passband.

The coupled line 2026 is connected to a ground pattern 108 formed on the conductive pattern layer L1. The ground pattern 108 has one or a plurality of vias 2027 formed therein. The vias 2027 electrically connect the ground pattern 108 to the first ground layer 102. In FIG. 3, "L2 GND" means that the conductive pattern 202 uses, as a reference ground, the first ground layer 102 corresponding to the second layer as a wiring layer.

The high-frequency circuit 2 further includes a radio filter that is disposed in an area, in the second area 107, different from the area where the conductive pattern 202 is disposed. Generally, a radio filter is a low-pass filter (LPF) composed of an inductor and a capacitor. In a radio filter 203 shown in FIG. 3, an inductor is composed of a coil and a pattern. The radio filter 203 is connected to the radio input/output terminal 1D. The configuration of an electric circuit of the radio filter 203 is well known and therefore will not be described in detail.

As described above, in the high-frequency circuit 2 and the radio device 1 according to the present embodiment, since the conductive pattern 201 is disposed in the first area 105, the distance from the conductive pattern 201 to the electric conductor formed in the second ground layer 104 can be increased. When the distance from the conductive pattern 201 to the electric conductor formed in the second ground layer 104 is increased, the characteristic impedance of the conductive pattern 201 rises. Therefore, a reduction in the characteristic impedance of the conductive pattern 201 due to an increase in the width of the conductive pattern 201 can be offset by the increase in the distance from the conductive pattern 201 to the electric conductor formed in the second ground layer 104. Thus, the width of the conductive pattern 201 can be increased while maintaining a desired characteristic impedance. Therefore, the degree of freedom in device design can be increased while realizing a desired impedance in the pattern filter.

Moreover, in a case where an SIR having a coupled line is formed by using a conductive pattern, when the conductive pattern 201 is disposed in the first area 105, a reduction in the characteristic impedance of the conductive pattern 201 due to an increase in the width of the conductive pattern 201 can be offset by an increase in the electrical distance from the conductive pattern 201 to the electric conductor formed in the second ground layer 104. Thus, the coupled line 2016 can be shortened while maintaining a desired characteristic impedance. Therefore, the degree of freedom in device design can be increased while realizing a desired impedance in the pattern filter.

Modifications

Figure 5:
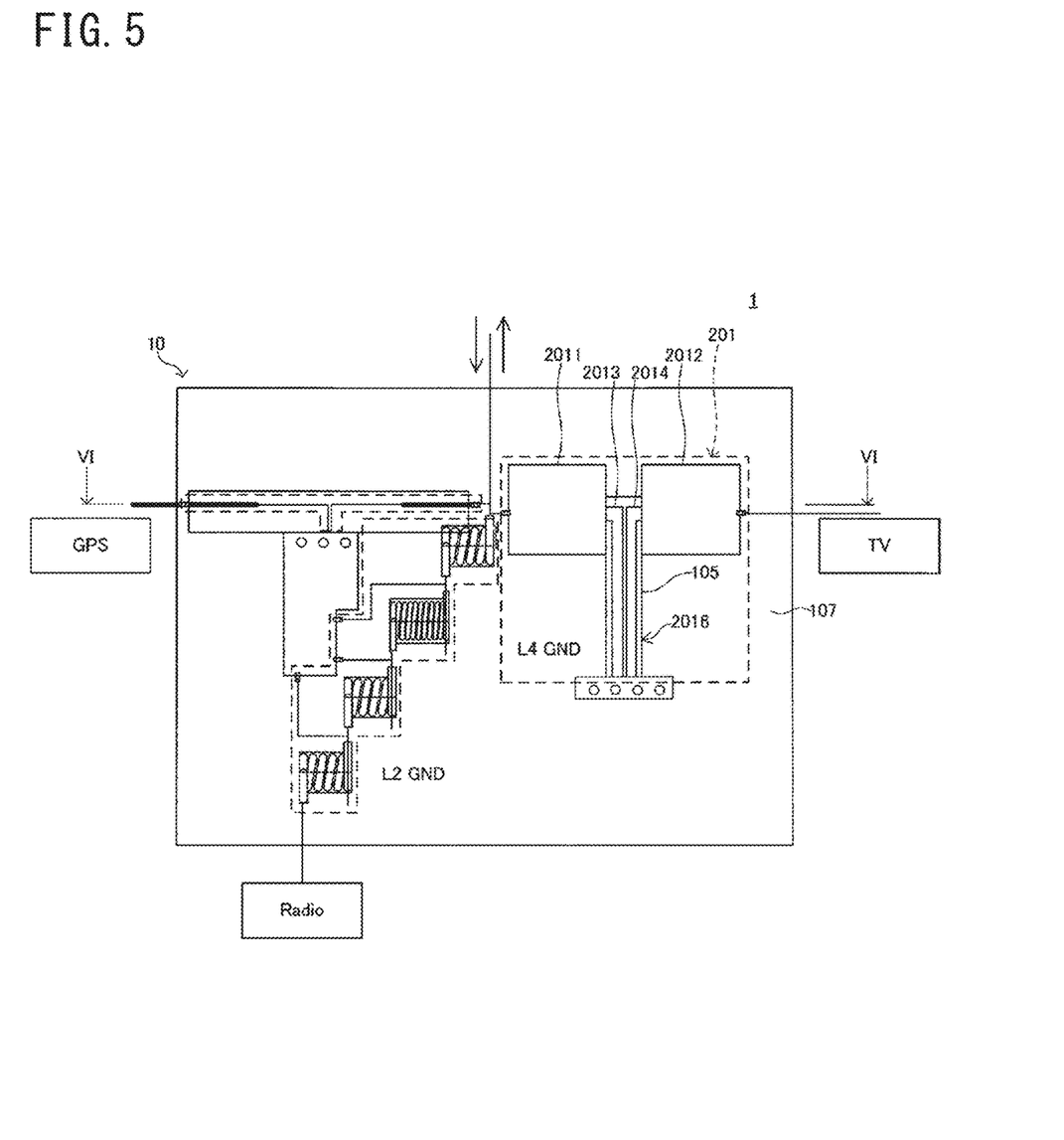
FIG. 5 is a plan view showing a configuration of a radio device according to a modification of the embodiment of the present disclosure.

FIG. 5 is a plan view showing a configuration of a radio device according to a modification of the embodiment of the present disclosure. In the radio device shown in FIG. 5, the low impedance parts 2011, 2012 and the first area 105 in the conductive pattern 201 are smaller than those in the radio device shown in FIG. 3.

Figure 6:
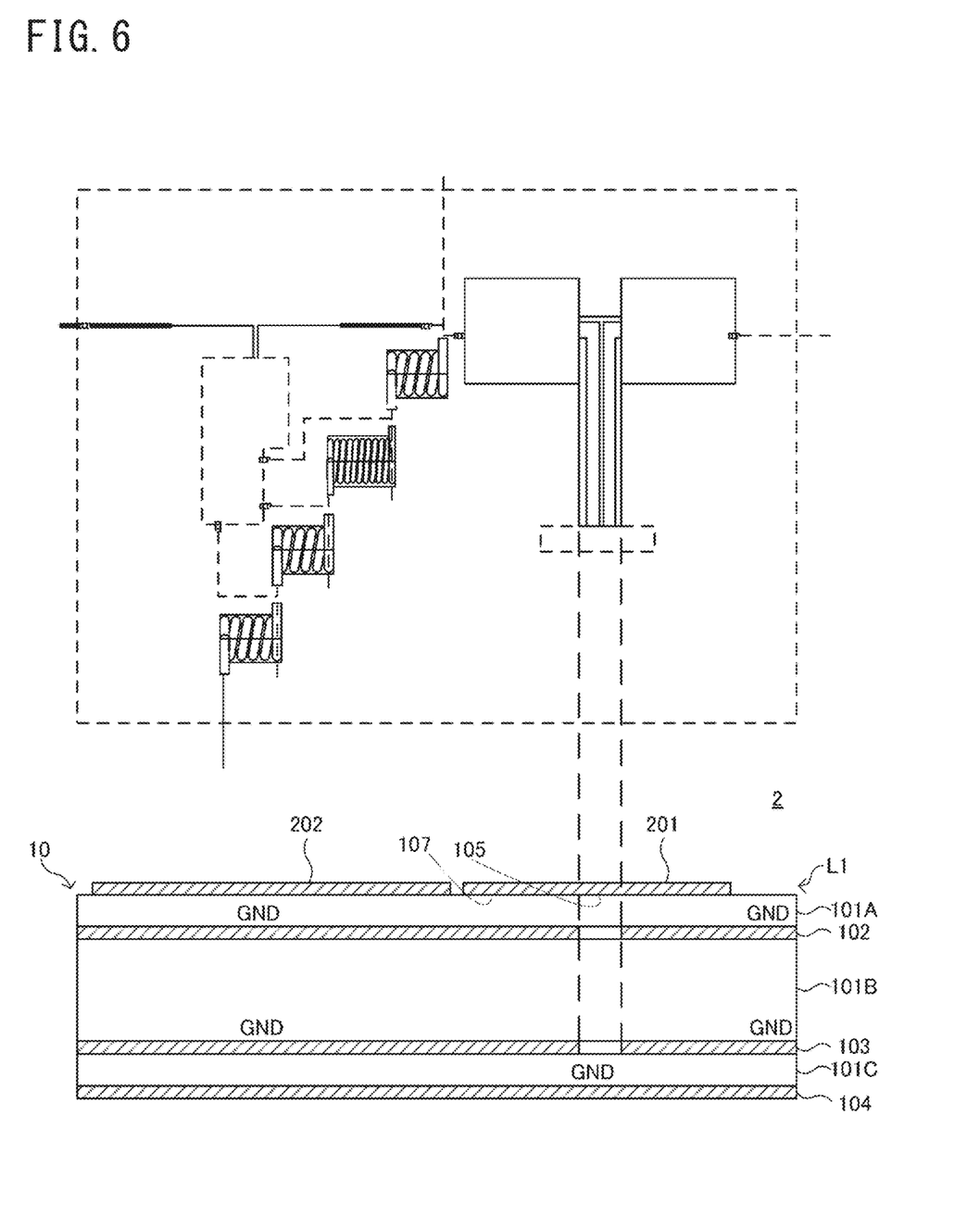
FIG. 6 is a cross-sectional view taken along a line VI-VI in FIG. 5.

FIG. 6 is a cross-sectional view taken along a VI-VI line in FIG. 5. For facilitating the understanding, in FIG. 6, the plan view shown in FIG. 5 is represented by broken lines except for the conductive patterns.

With reference to FIG. 5 and FIG. 6, in the radio device 1 according to the modification, the conductive pattern 201 is disposed over the first area 105 and the second area 107. Specifically, in the conductive pattern 201, the high impedance parts 2013, 2014 are disposed in the first area 105 and the low impedance parts 2011, 2012 are disposed in the second area 107.

Even in this case, a part of the conductive pattern 201 opposes the second ground layer 104 in the lamination direction. Therefore, the electrical distance from the conductive pattern 201 to the reference ground can be increased, whereby the degree of freedom in device design can be further increased while realizing a desired characteristic impedance.

The embodiments disclosed herein are merely illustrative in all aspects and should not be recognized as being restrictive. The scope of the present disclosure is defined not by the above description but by the scope of the claims, and is intended to include meaning equivalent to the scope of the claims and all modifications within the scope.

In the conductive pattern layer L1, the position of the first area 105 is not particularly limited. The first area 105 only needs to be provided such that the characteristic impedance of the conductive pattern 201 becomes a constant value with respect to the frequency of a target signal, i.e., an RF signal received at the antenna connected to the input/output terminal 1A. For example, it is preferable that the first area 105 is provided such that a variation width of the characteristic impedance of the conductive pattern 201 with respect to a variation in the frequency of the RF signal received at the antenna connected to the input/output terminal 1A, is less than 5%. More preferably, the first area 105 is provided such that the variation width is less than 3%, and further preferably, the first area 105 is provided such that the variation width is less than 1%.

In the above description, the high-frequency circuit 2 includes the radio filter 203. However, the high-frequency circuit 2 may not necessarily include the radio filter 203.

In the above description, each of the television filter including the conductive pattern 201 and the GPS filter including the conductive pattern 202 is an SIR having a coupled line. However, in the high-frequency circuit 2, the filter is not limited to an SIR having a coupled line. The filter may be an SIR composed of a single line, or a pattern filter composed of a conductor pattern having a constant width. This filter is formed of a conductor pattern having a constant width in the conductive pattern layer L1 of the multilayer board 10, and is disposed in the first area 105 that opposes the second ground layer 104 in the lamination direction.

In the above description, as shown in FIG. 3, the conductive patterns 201, 202 are formed on the main surface of the multilayer board 10 (on the layer L1 on which the filters are formed). However, the layer at which the conductive patterns 201, 202 are formed is not limited thereto. The conductive patterns 201, 202 may be formed at a layer lower than the main surface, i.e., a layer inside the multilayer board 10. For example, in the multilayer board 10 shown in FIG. 3, the conductive pattern layer L1 may be disposed at a position one layer below the main surface (in FIG. 4, at a position where the first ground layer 102 is present). In this case, the first ground layer may be disposed at a position two layers below the main surface (in FIG. 4, at a position where the intermediate ground layer 103 is present), or may be disposed at the main surface. In the case where the first ground layer is disposed at the main surface, the second ground layer may be disposed at a position two layers below the main surface (in FIG. 4, at a position where the intermediate ground layer 103 is present). Both the first ground layer 102 and the second ground layer 104 may be disposed at positions higher than or lower than the conductive pattern layer L1. One of the first ground layer 102 and the second ground layer 104 may be disposed at a position higher than the conductive pattern layer L1 while the other layer may be disposed at a position lower than the conductive pattern layer L1. That is, placement of the conductive pattern layer L1, the first ground layer 102, and the second ground layer 104 is not limited to the example shown in FIG. 3, and these layers may be disposed anywhere as long as the electrical distance from the conductive pattern layer L1 to the first ground layer 102 is different from the electrical distance from the conductive pattern layer L1 to the second ground layer 104.

In the above description, as shown in FIG. 3, the first ground layer 102 has a shape in which the electric conductor is partially removed. However, the first ground layer 102 and the intermediate ground layer 103 are not limited thereto. For example, in the case where one of the first ground layer 102 and the second ground layer 104 is disposed at a position higher than the conductive pattern layer L1 while the other layer is disposed at a position lower than the conductive pattern layer L1 and the electrical distance from the conductive pattern layer L1 to the second ground layer 104 is longer than the electrical distance from the conductive pattern layer L1 to the first ground layer 102, the first ground layer 102 may have a shape in which the electric conductor is formed over the entire surface thereof. In this case, the entirety of the conductive pattern layer L1 is the first area 105, and does not include the second area 107. That is, it is only necessary for the conductive pattern layer L1 to include the first area 105 in which the electrical distance to the electric conductor formed in the second ground layer 104 is longer than the electrical distance to the electric conductor formed in the first ground layer 102, and for at least a part of the conductive pattern 201 to be formed in the first area 105.

In the above description, the multilayer board 10 includes the intermediate ground layer 103. However, the multilayer board 10 only needs to include the first ground layer 102 and the second ground layer 104, and may not necessarily include the intermediate ground layer 103. In the case where the multilayer board 10 includes the intermediate ground layer 103, the multilayer board 10 may include a plurality of intermediate ground layers 103.

In the above description, the first ground layer 102 is disposed between the dielectric layers 101A, 101B, and the second ground layer 104 is disposed at the rear surface of the multilayer board 10. However, placement of the first ground layer 102 and the second ground layer 104 is not limited thereto. The second ground layer 104 only needs to be disposed at a position lower than the first ground layer 102.

In the above description, the radio device 1 is mounted on a vehicle. However, the radio device 1 is not limited thereto. The radio device 1 may be mounted on transport equipment other than vehicles, may be installed in buildings, or may be portable wireless equipment. That is, the radio device 1 may be any equipment that performs radio communication.

The above description includes the features in the additional notes below.

Additional Note 1

A radio device comprising:
a multilayer board;
a filter formed of a conductive pattern in the multilayer board; and
a stepped impedance resonator having a coupled line, and formed of a conductive pattern in a layer, in the multilayer board, at which the filter is formed, wherein
the multilayer board includes
a first ground layer disposed at a layer different from the filter, and
a second ground layer disposed at a layer different from the filter and the first ground layer,
an electrical distance from the layer at which the filter is formed to the second ground layer is longer than an electrical distance from the layer at which the filter is formed to the first ground layer,
the layer at which the filter is formed includes a first area that opposes the second ground layer in a lamination direction, and
the stepped impedance resonator is disposed in the first area.

Additional Note 2

A radio device comprising:
a multilayer board including a first ground layer, and a second ground layer that is disposed at a layer different from the first ground layer; and
a filter formed of a conductive pattern, and disposed at a layer different from the first ground layer and the second ground layer in the multilayer board, wherein
an electrical distance from a layer at which the filter is formed to the second ground layer is longer than an electrical distance from the layer at which the filter is formed to the first ground layer,
the layer at which the filter is formed includes a first area that opposes the second ground layer in a lamination direction, and
the filter is disposed in the first area.

REFERENCE SIGNS LIST 1 radio device
2 high-frequency circuit
1A input/output terminal
1B television input/output terminal
1C GPS input/output terminal
1D radio input/output terminal
1E high-frequency cable
1F1 to 1F4 capacitor
10 multilayer board
L1 layer having a conductive pattern formed thereon (conductive pattern layer)
100 filter
101A, 101B, 101C dielectric layer
102 first ground layer
103 intermediate ground layer
104 second ground layer
105 first area
106, 108 ground pattern
107 second area
1001 dielectric layer
1002 conductive pattern
1003 ground layer
200 band-pass filter
201 conductive pattern
2001A, 2001B low impedance part
2002A, 2002B high impedance part
2003 coupled line
2011, 2012 low impedance part
2013, 2014 high impedance part
2016 coupled line
2017 via
202 conductive pattern
2021, 2022 low impedance part
2023, 2024 high impedance part
2026 coupled line
2027 via
203 radio filter

The invention claimed is:
1. A high-frequency circuit comprising:
a first ground layer having an electric conductor formed therein;

a second ground layer having an electric conductor formed therein; and a conductive pattern layer having a first conductive pattern and a second conductive pattern formed thereon, wherein the first ground layer, the second ground layer, and the conductive pattern layer are laminated one on another, a spatial distance from the conductive pattern layer to the second ground layer is longer than a spatial distance from the conductive pattern layer to the first ground layer, the conductive pattern layer includes a first area in which at least a part of the first conductive pattern is disposed and a second area in which at least a part of the first conductive pattern is disposed, a cavity is formed in a portion of the first ground layer opposing the first area in a lamination direction in which the first ground layer, the second ground layer and the conductive pattern layer are laminated, and the electric conductor is formed in a portion of the second ground layer opposing the second area in the lamination direction, and among electrical distance from the first area to the electric conductor formed in the second ground layer and an electrical distance from the second area to the electric conductor formed in the first ground layer, the electrical distance from the first area to the electric conductor formed in the second ground layer is longer, in the lamination direction.

2. The high-frequency circuit according to claim 1, wherein the first conductive pattern is disposed over the first area and the second area.

3. The high-frequency circuit according to claim 1, wherein
the first conductive pattern forms a part of a first filter,
the second conductive pattern forms a part of a second filter, and
the second filter has a fractional bandwidth that is narrower than a fractional bandwidth of the first filter.

4. The high-frequency circuit according to claim 1, wherein the first area is provided such that a characteristic impedance of the first conductive pattern becomes a constant value with respect to a frequency of a target signal.

5. A radio device including the high-frequency circuit according to claim 1.

6. The high-frequency circuit according to claim 1, wherein
the first conductive pattern forms a first part of a filter, and
the second conductive pattern forms a second part of the filter.

7. The high-frequency circuit according to claim 1, wherein
the first conductive pattern forms a part of a first filter, and
the first filter is a stepped impedance resonator including a low impedance part composed of one part of the first conductive pattern and a high impedance part composed of another part of the first conductive pattern.

8. The high-frequency circuit according to claim 7, wherein
the high impedance part is disposed in the first area, and
the low impedance part is disposed in the second area.

9. A radio device comprising:
a multilayer board including a first ground layer, and a second ground layer that is disposed at a layer different from the first ground layer; and
a filter formed of a conductive pattern, and disposed at a layer different from the first ground layer and the second ground layer in the multilayer board, wherein
the layer at which the filter is formed includes a first area and a second area,
a cavity is formed in a portion of the first ground layer opposing the first area in a lamination direction in which the first ground layer, the second ground layer and the filter are laminated, and the electric conductor is formed in a portion of the second ground layer opposing the second area in the lamination direction,
an electrical distance from the second area to the second ground layer is longer than an electrical distance from the first area to the first ground layer, and
the filter is disposed in the first area.

10. A radio device comprising:
a multilayer board;
a filter formed of a conductive pattern in the multilayer board; and
a stepped impedance resonator having a coupled line, and formed of a conductive pattern in a layer, in the multilayer board, at which the filter is formed, wherein
the multilayer board includes
a first ground layer disposed at a layer different from the filter, and
a second ground layer disposed at a layer different from the filter and the first ground layer,
the layer at which the filter is formed includes a first area and a second area,
a cavity is formed in a portion of the first ground layer opposing the first area in a lamination direction in which the first ground layer, the second ground layer and the filter are laminated, and the electric conductor is formed in a portion of the second ground layer opposing the second area in the lamination direction,
an electrical distance from the second area to the second ground layer is longer than an electrical distance from the first area to the first ground layer, and
the stepped impedance resonator is disposed in the first area.

* * * * *